(12) United States Patent
Jimenez

(10) Patent No.: US 8,344,420 B1
(45) Date of Patent: Jan. 1, 2013

(54) ENHANCEMENT-MODE GALLIUM NITRIDE HIGH ELECTRON MOBILITY TRANSISTOR

(75) Inventor: Jose Jimenez, Dallas, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 183 days.

(21) Appl. No.: 12/509,144

(22) Filed: Jul. 24, 2009

(51) Int. Cl.
 *H01L 29/66* (2006.01)
(52) U.S. Cl. ............................ 257/192; 257/76; 257/194
(58) Field of Classification Search ................... 257/76, 257/192, 194
See application file for complete search history.

(56) References Cited

U.S. PATENT DOCUMENTS

| 6,045,614 | A | 4/2000 | De Lyon et al. |
| 6,270,573 | B1 | 8/2001 | Kitabatake |
| 6,447,604 | B1 | 9/2002 | Flynn |
| 6,605,831 | B1 | 8/2003 | Inai |
| 6,624,452 | B2 | 9/2003 | Yu |
| 6,954,473 | B2 | 10/2005 | Dehmubed |
| 7,118,813 | B2 | 10/2006 | Xu |
| 7,879,147 | B2 | 2/2011 | Xu |
| 2002/0177261 | A1 | 11/2002 | Song |
| 2005/0103257 | A1 | 5/2005 | Xu |
| 2005/0274980 | A1* | 12/2005 | Miyoshi .................. 257/192 |
| 2006/0163594 | A1 | 7/2006 | Kuzmik |
| 2006/0228584 | A1 | 10/2006 | Xu et al. |
| 2007/0164299 | A1* | 7/2007 | Lahreche et al. ............. 257/97 |
| 2008/0113496 | A1 | 5/2008 | Keller et al. |
| 2008/0157058 | A1* | 7/2008 | Hudait et al. ................. 257/14 |
| 2008/0203430 | A1 | 8/2008 | Simin |
| 2008/0237638 | A1* | 10/2008 | Bito ........................... 257/192 |

OTHER PUBLICATIONS

Non-Final Office Action in U.S. Appl. No. 12/236,438 mailed Oct. 27, 2009
Final Office Action in U.S. Appl. No. 12/236,438 mailed Aug. 3, 2010.
Non-Final Office Action in U.S. Appl. No. 12/236,438 mailed Dec. 21, 2010.
Final Office Action in U.S. Appl. No. 12/236,438 mailed Jun. 21, 2011.
Non-Final Office Action in U.S. Appl. No. 15/509,144 mailed Jan. 23, 2012.

* cited by examiner

*Primary Examiner* — Tan N Tran
(74) *Attorney, Agent, or Firm* — Schwabe Williamson & Wyatt

(57) ABSTRACT

Embodiments include but are not limited to apparatuses and systems including a heterostructure having a first barrier layer, a gallium nitride channel layer on the first barrier layer, and a second barrier layer on the gallium nitride channel layer and including a first sublayer, a second sublayer, and a third sublayer. The first barrier layer, the first sublayer, and the third sublayer may each include aluminum. Other embodiments may be described and claimed.

14 Claims, 6 Drawing Sheets

ENHANCEMENT-MODE GALLIUM NITRIDE HIGH ELECTRON MOBILITY TRANSISTOR

TECHNICAL FIELD

Embodiments of the present invention relate generally to microelectronic devices and more particularly to enhancement-mode gallium nitride high electron mobility transistors, and circuits incorporating such transistors.

BACKGROUND

Gallium nitride high electron mobility transistors (HEMTs) are used in a number of applications due at least in part to their simultaneous high power and high frequency operation. The channel layer of these transistors is capable of supporting large electric fields, and thus, high voltages, at small drain-source spacing. The nearly lattice-matched barrier layer is capable of providing an effective barrier for carrier confinement, and thus, allows the transistor to deliver large current densities. For those HEMTs formed on silicon carbide substrates, desirable thermal and isolation properties can be achieved.

Typically, gallium nitride HEMTs are depletion-mode transistors (D-mode or "normally-on" transistors). Gallium nitride HEMTs of the enhancement-mode (E-mode or "normally-off" transistors) are more rare. Unlike gallium arsenide HEMTs, the channel charge of gallium nitride HEMTs generally cannot be controlled by uniform or delta doping in the barrier. Rather, the charge in the gallium nitride channel is controlled by spontaneous and piezoelectric polarizations of the channel-barrier interface. As illustrated in the conduction band diagram (solid black line) in FIG. 1, under a typical growth condition (gallium face), electrons in the gallium nitride channel 102 are typically attracted to the barrier layer 104, thereby forming a channel under zero bias conditions. The electron wave function (hashed black line) shows where the electrons will tend to accumulate.

Methods for producing E-mode gallium nitride HEMTs sometimes include treating the surface of the transistor with fluorine, thereby creating enough deep surface states in the gate to pin the Fermi level deep inside the band gap and deplete the gallium nitride channel of electrons. Modifying the surface of the transistor in such a way, however, may not be reproducible and can affect the device reliability.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

The phrase "formed on," along with its derivatives, may be used herein. "Formed on" in the context of "a layer being formed on another layer" may mean that a layer is formed above, but not necessarily in direct physical or electrical contact with, another layer, e.g., there may be one or more other layers interposing the layers. In some embodiments, however, "formed on" may mean that a layer is in direct physical contact with at least a portion of a surface of another layer.

For the purposes of the present disclosure, the phrase "A/B" means A or B. The phrase "A and/or B" means (A), (B), or (A and B). The phrase "at least one of A, B, and C" means (A), (B), (C), (A and B), (A and C), (B and C), or (A, B and C). The phrase "(A)B" means (B) or (A and B), that is, A is an optional element. In addition, although embodiments of the present disclosure may be shown and described as including a particular number of components or elements, embodiments are not limited to any particular number of components or elements.

Figure 1:
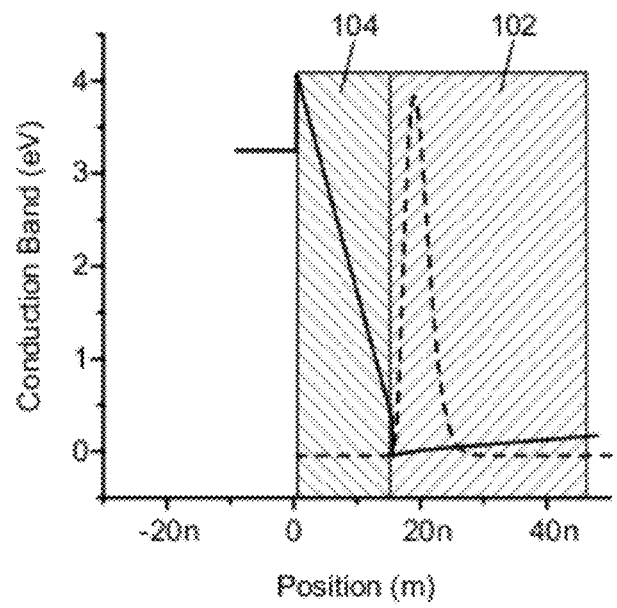
FIG. 1 is a conduction band diagram of a related-art gallium nitride high electron mobility transistor.
Figure 2:
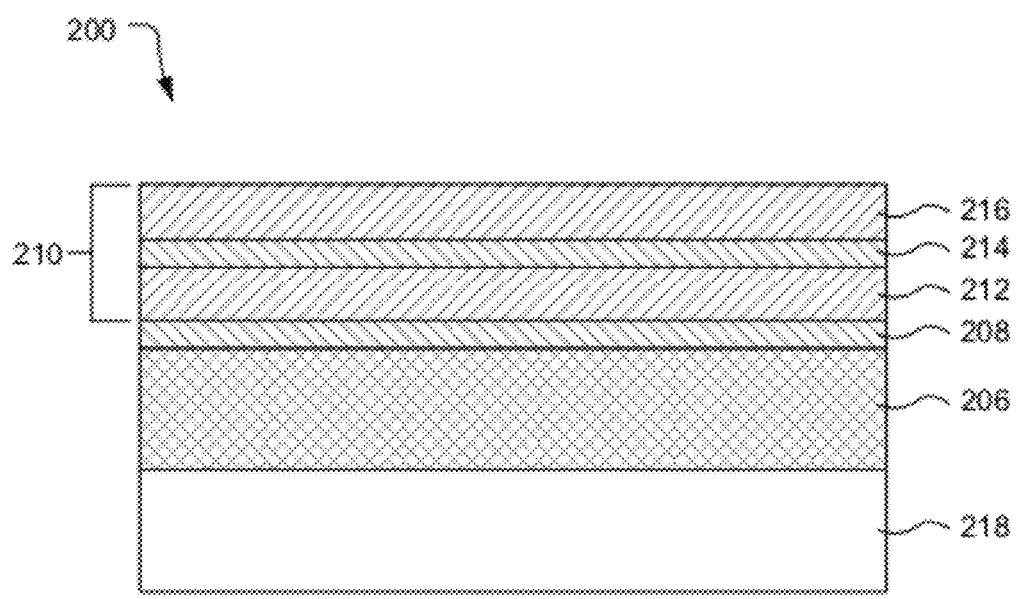
FIG. 2 is a cross-sectional view of a heterostructure that may be used for forming an E-mode gallium nitride high electron mobility transistor in accordance with various embodiments.

Turning now to FIG. 2, illustrated is a cross-sectional view of a basic layer stack 200 for constructing an E-mode gallium nitride (GaN) high electron mobility transistor (HEMT) structure in accordance with various embodiments. The layer stack 200 includes a first barrier layer 206, a GaN channel layer 208 on the first barrier layer 206, and a second barrier layer 210 on the channel layer 208. The layer stack 200 may be formed on a substrate 218. The second barrier layer 210 may include a first sublayer 212, a second sublayer 214, and a third sublayer 216.

The first barrier layer 206, the first sublayer 212, and the third sublayer 216 may each include aluminum, while the second sublayer 214 includes no aluminum or aluminum in a concentration less than that of each of the first barrier layer 206, the first sublayer 212, and the third sublayer 216. The relative compositions of the layers may allow the electric field in the second sublayer 214 to be reversed relative to an electric field in the first sublayer 212 and the electric field in the third sublayer 216. A heterostructure that were to include the first barrier layer 206, the channel layer 208, the first sublayer 212, and the second sublayer 214, without the third sublayer 216, would result in the depletion of electrons in the channel layer 208 at zero voltage as required for E-mode operation. A heterostructure including the third sublayer 216, in addition to layers the first barrier layer 206, the channel layer 208, the first sublayer 212, and the second sublayer 214, results in the attraction of electrons back to the channel layer 208 at zero voltage, thereby allowing for low access-resistance, and thus, optimal electrical characteristics.

Figure 3:
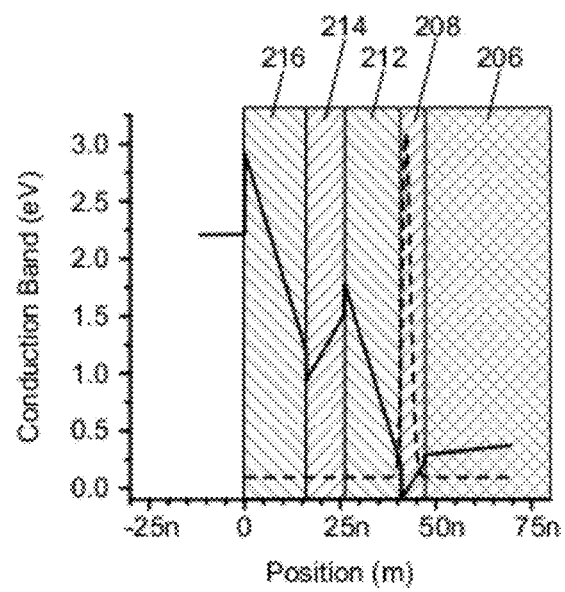
FIG. 3 is a conduction band diagram of an E-mode gallium nitride high electron mobility transistor in accordance with various embodiments.

The reversal of electric field may be understood more clearly with reference to the conduction band diagram (solid black line) in FIG. 3, with the electron wave function (hashed black line) showing where the electrons will tend to accumulate. As illustrated, the reversal of the electric field in the second sublayer 214 may repel the electrons in the channel layer 208, thereby resulting in the depletion of electrons in the channel layer 208 at zero voltage. The third sublayer 216 returns the field to its normal direction, resulting in electrons being attracted back to the GaN channel 208.

As noted, the first barrier layer 206, the first sublayer 212, and the third sublayer 216 may each include aluminum. In various embodiments, one or more of the first barrier layer 206, the first sublayer 212, and the third sublayer 216 may comprise aluminum gallium nitride (AlGaN), and the second sublayer 214 may comprise GaN.

The particular aluminum contents of the first barrier layer 206, the first sublayer 212, and the third sublayer 216 may depend at least in part on the compositions of the other layers of the layer stack 200. In various embodiments, the first sublayer 212 and the third sublayer 216 may each comprise $Al_xGa_{(1-x)}N$, wherein x is 0.2-0.3 (i.e., 20-30%), while the first barrier layer 206 may comprise $Al_yGa_{(1-y)}N$, wherein y is some value less than x. In various embodiments, y may be 0.05-0.1 (i.e., 5-10%). In an example embodiment, the first sublayer 212 and the third sublayer 216 each comprise $Al_{0.2}Ga_{0.8}N$, while the first barrier layer 206 comprises $Al_{0.06}Ga_{0.94}N$. Other compositions may be similarly suitable.

In various embodiments, one or more of the first sublayer 212, the second sublayer 214, and the third sublayer 216 may be doped or undoped, depending on the application. Doping may result in increased current capability.

The particular thicknesses of the layers of the layer stack 200 may depend at least in part on the thicknesses of the other layers of the layer stack 200. In various embodiments, the first barrier layer 206 may be the thickest layer of the layer stack 200 aside from the substrate 218. In an example embodiment, the first sublayer 212 and the third sublayer 216 may each be substantially 150 Angstroms (A) thick, the second sublayer 214 may be substantially 100 A thick, the first barrier layer 206 may be substantially 1.5 micrometers thick, and the GaN channel layer 208 may be substantially 400 A thick. Other thicknesses may be similarly suitable.

The substrate 218 may comprise any material suitable for the application. In various embodiments, for example, the substrate 218 comprises silicon carbide (SiC). SiC may be particularly suitable for devices having high radio frequency power and high frequency operation due at least in part to the thermal and isolation properties of SiC. In other embodiments, however, the substrate 218 may comprise silicon, sapphire, aluminum nitride, GaN, or some combination thereof or some combination with another suitable material. In general, the selected material for the substrate 218 need not be the same material as the material of the device layers.

Figure 4:
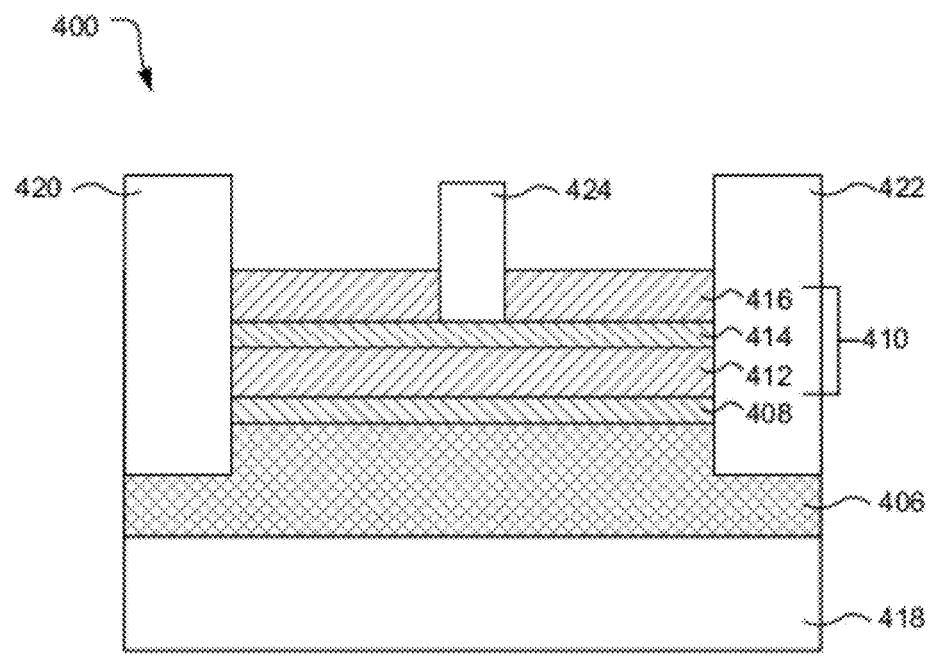
FIG. 4 is a cross-sectional view of an E-mode gallium nitride high electron mobility transistor in accordance with various embodiments.

FIG. 4 is a cross-sectional view of an E-mode GaN HEMT 400 in accordance with various embodiments. The HEMT 400 includes some of the features of the layer stack 200 described herein including, for example, a first barrier layer 406 on a substrate 418, a GaN channel layer 408 on the first barrier layer 406, and a second barrier layer 410 on the channel layer 408. The second barrier layer 410 includes a first sublayer 412, a second sublayer 414, and a third sublayer 416.

The HEMT 400 further includes drain 420, source 422, and gate 424 electrodes. As illustrated, the heterostructure may include a recess beyond the third sublayer 416 so that the gate 424 contacts the second sublayer 414. By recessing the gate 424 to the second sublayer 414, the E-mode may be achieved. The access regions between drain 420 and gate 424 and between source 422 and gate 424 include the full heterostructure, allowing for a full channel at zero V, and thus, a lower access resistance. In various other embodiments, however, the gate 424 may be recessed less than that illustrated.

In various embodiments, the gate 424 may include a fluorine surface treatment. The fluorine surface treatment may result in the creation of deep surface states in the gate 424 to further pin the Fermi level deep inside the band gap and deplete the GaN channel layer 408 of electrons.

Figure 5:
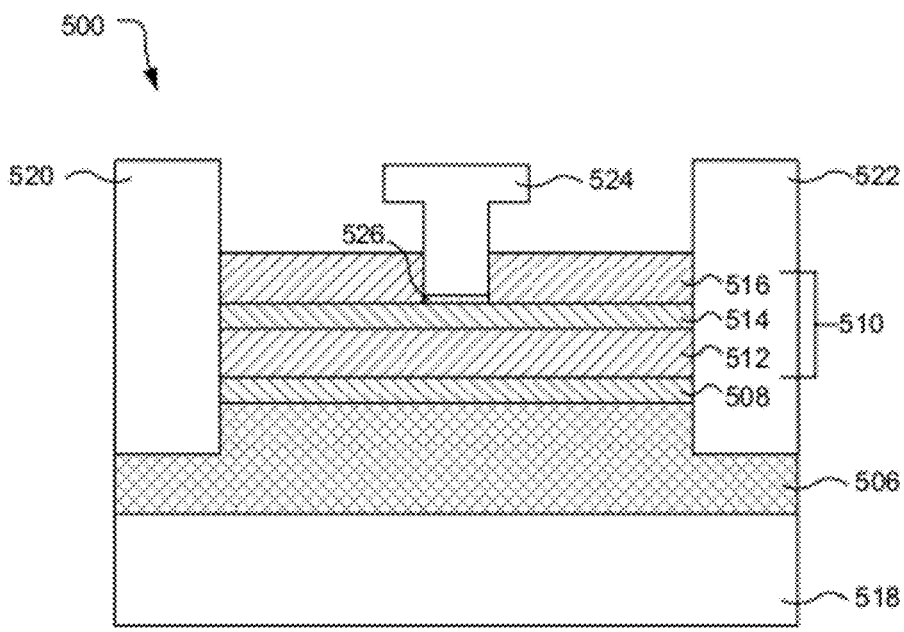
FIG. 5 is a cross-sectional view of another E-mode gallium nitride high electron mobility transistor in accordance with various embodiments.

FIG. 5 is a cross-sectional view of another E-mode GaN HEMT 500 in accordance with various embodiments. The HEMT 500 includes some of the features of the layer stack 200 described herein including, for example, a first barrier layer 506 on a substrate 518, a GaN channel layer 508 on the first barrier layer 506, and a second barrier layer 510 on the channel layer 508. The second barrier layer 510 includes a first sublayer 512, a second sublayer 514, and a third sublayer 516.

The HEMT 500 further includes drain 520, source 522, and gate 524 electrodes. In contrast to previous embodiments, a layer of insulating material 526 (e.g., oxide or nitride) is deposited between the gate 524 and the second sublayer 514, after recess formation in the third sublayer 516 and prior to gate metal deposition, creating what is known as a metal-insulator-semiconductor (MIS) structure. As discussed previously, E-mode may be achieved by including a recess in the heterostructure down to the second sublayer 514. The access regions between drain 520 and gate 524 and between source 522 and gate 524 include the full heterostructure, allowing for a full channel at zero V, and thus, a lower access resistance.

Figure 6:
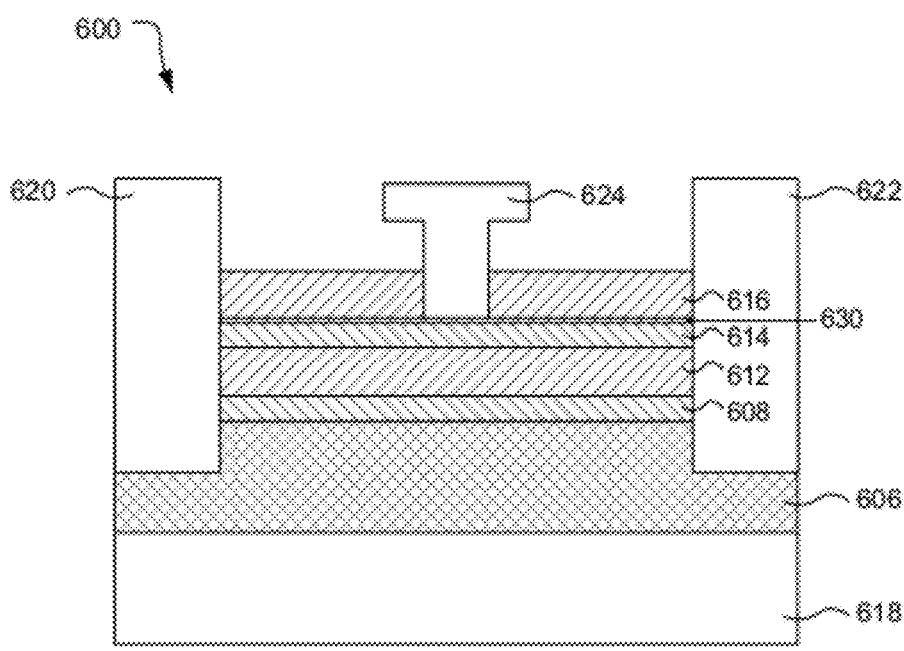
FIG. 6 is a cross-sectional view of another E-mode gallium nitride high electron mobility transistor in accordance with various embodiments.

FIG. 6 is a cross-sectional view of another E-mode GaN HEMT 600 in accordance with various embodiments. The HEMT 600 includes some of the features of the layer stack 200 described herein including, for example, a first barrier layer 606 on a substrate 618, a GaN channel layer 608 on the first barrier layer 606, and a second barrier layer including a first sublayer 612, a second sublayer 614, and a third sublayer 616.

The HEMT 600 further includes drain 620, source 622, and gate 624 electrodes. As illustrated, the gate 624 may be recessed into the third sublayer 616 so that the gate 624 contacts the second sublayer 614.

As illustrated, the HEMT 600 further includes an etch stop layer 630 to help prevent the gate 624 from recessing into the second sublayer 614. In other words, when an opening is etched into the third barrier layer 616 at the location at which the gate 624 will be formed, the etch will be stopped or slowed by the etch stop layer 630.

The etch stop layer 630 may comprise any material suitable for the purpose. In various embodiments, the etch stop layer 630 may comprise indium gallium nitride (InGaN), aluminum nitride (AlN), or any other suitable material. In various embodiments, instead of depositing a separate layer for forming the etch stop layer 630, the etch stop layer 630 may instead be formed by doping the top surface of the second sublayer 614. The doping may, in effect, act to stop or slow the etch used to form the opening for the gate 624.

The gate geometry of the transistor described herein can be a T-gate (e.g., gates 524 and 624 of FIGS. 5 and 6, respectively), in the form of a Gamma or a reverse Gamma gate. Furthermore, the gate can be constructed using a T-gate process approach or a high-voltage process approach in which a passivation material is deposited in the access region pre- or post-gate-formation.

Figure 7:
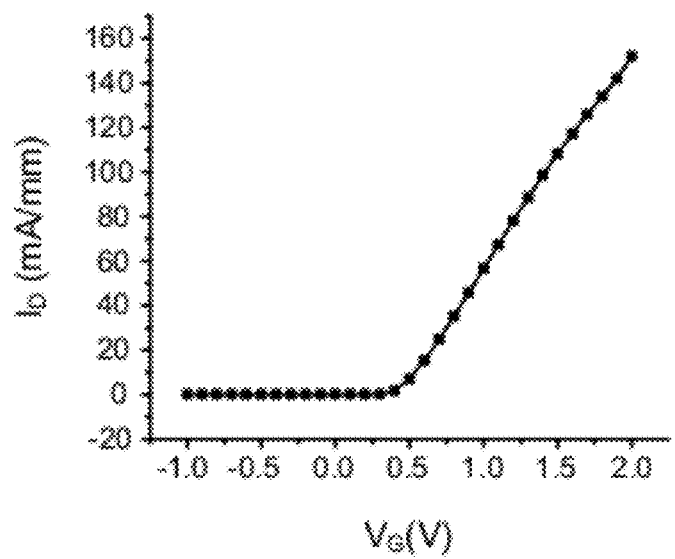
FIG. 7 is a simulated transfer curve for an E-mode gallium nitride high electron mobility transistor in accordance with various embodiments.
Figure 8:
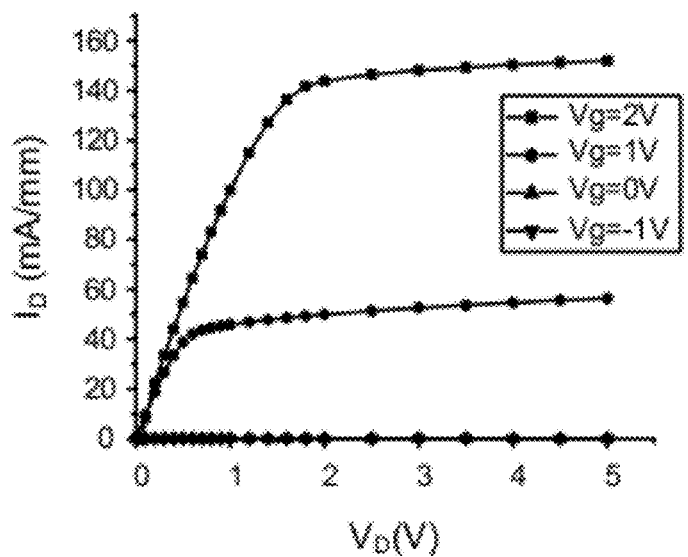
FIG. 8 is a simulated $I_D$-$V_D$ curve for an E-mode gallium nitride high electron mobility transistor in accordance with various embodiments.

Simulations performed on the various embodiments of E-mode GaN HEMTs described herein are illustrated in FIGS. 7 and 8. FIG. 7 is a simulated transfer curve for an E-mode GaN HEMT in accordance with various embodiments showing that no current flows in the channel at zero bias voltages, while FIG. 8 is a simulated $I_D$-$V_D$ curve showing no voltage at the drain for zero and negative bias voltages. Accordingly, it is evident that embodiments of the described HEMTs provide the electrical characteristics desired for operating in the E-mode. The channel is substantially depleted at zero bias voltages, with no current flowing between the source and the drain. At positive bias voltages, an electron channel is formed below the gate, with current flowing between the drain and the source.

Figure 9:
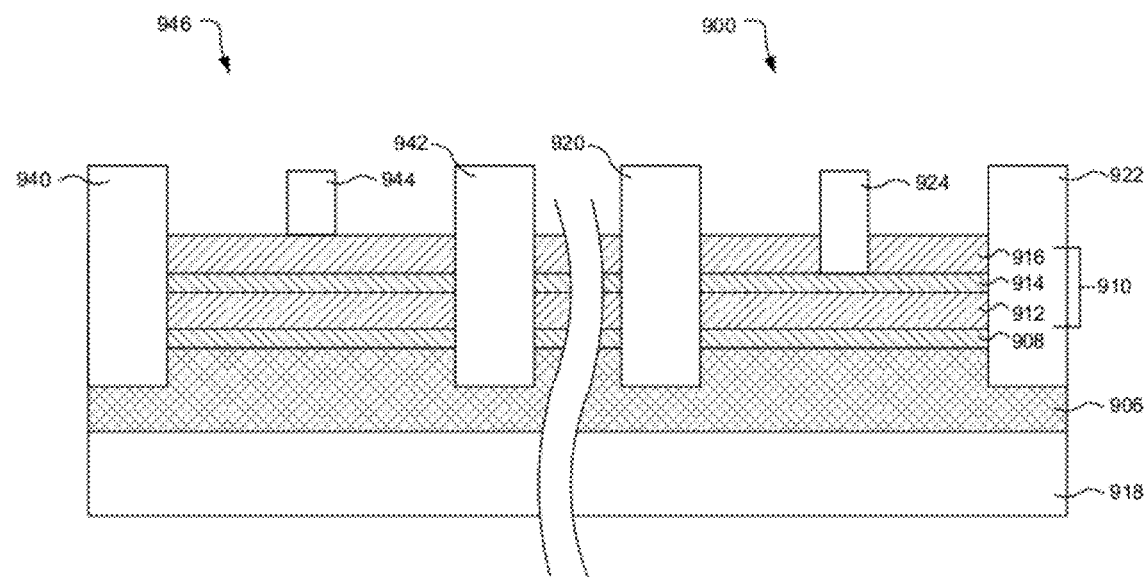
FIG. 9 is a cross-sectional view of an E-mode gallium nitride high electron mobility transistor and a D-mode gallium nitride high electron mobility transistor formed from the same heterostructure accordance with various embodiments.

Embodiments of heterostructures described herein can be used to construct both D- and E-mode HEMTs on the same wafer, a capability useful for constructing compact, high power ND converters and switches. As illustrated in FIG. 9, an E-mode HEMT 900 and a D-mode HEMT 946 are formed from the same heterostructure. The heterostructure includes a first barrier layer 906, a GaN channel layer 908 on the first barrier layer 906, and a second barrier layer 910 on the channel layer 908. The heterostructure may be formed on a substrate 918. The second barrier layer 910 may include a first sublayer 912, a second sublayer 914, and a third sublayer 916. The E-mode HEMT 900 includes drain 920, source 922, and gate 924 electrodes, with the gate electrode 924 being recessed down to the second sublayer 914.

The D-mode HEMT 946, on the other hand, does need not require a recessed gate. As illustrated, the D-mode HEMT 946 includes drain 940, source 942, and gate 944 electrodes, but the gate electrode 944 is on the third sublayer and not recessed down to the second sublayer 914.

Embodiments of HEMTs described herein may be incorporated into various apparatuses and systems. E-mode HEMTs may be particularly useful for enabling high power, high performance logic circuits (e.g., analog-to-digital converters) in radio-frequency (RF) applications. E-mode HEMTs may also be particularly useful in DC applications as a substitute for less-efficient silicon-based insulated gate bipolar transistors (IGBTs) in DC sources.

Figure 10:
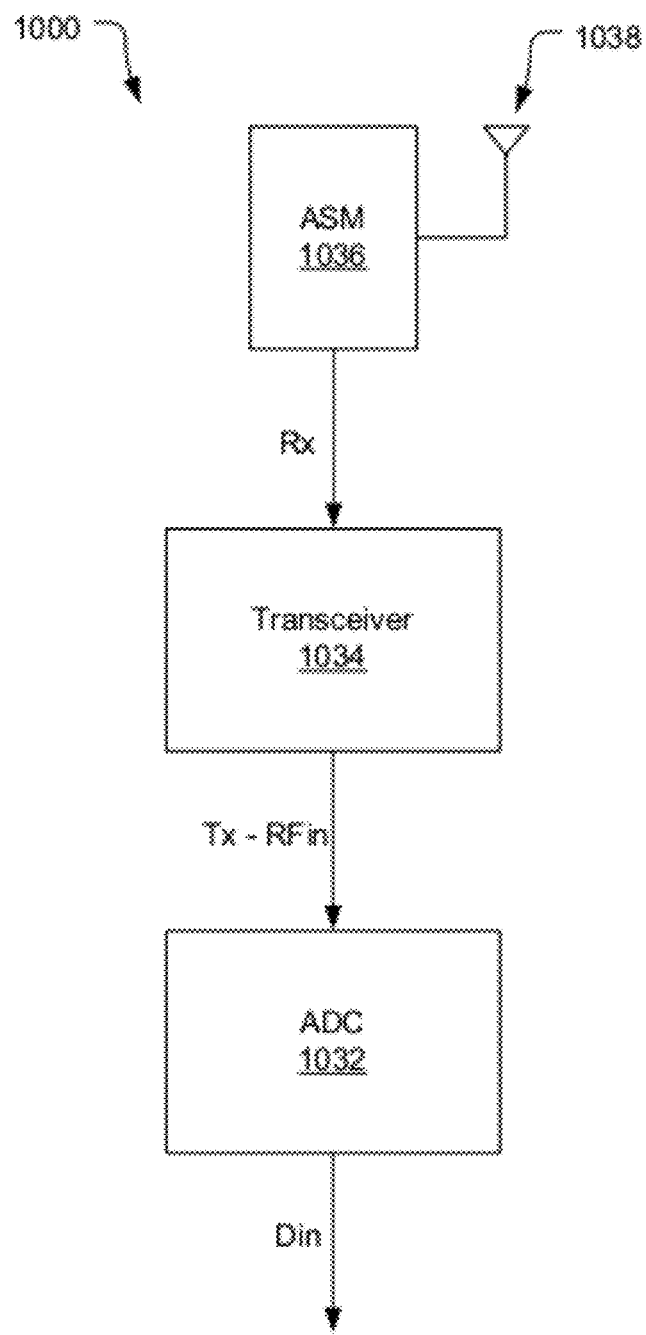
FIG. 10 is a block diagram of a system incorporating an E-mode gallium nitride high electron mobility transistor structure in accordance with various embodiments.

A block diagram of an example system 1000 is illustrated in FIG. 10. As illustrated, the system 1000 includes an analog-to-digital converter (ADC) 1032 that includes one or more E-mode HEMTs described herein. The ADC 1032 may be configured to convert received RF signals, Tx-RFin, to a digital input signal, Din, as illustrated.

The system 1000 may include a transceiver 1034 coupled with the ADC 1032 as shown. The transceiver 1034 may receive an RF input signal from an antenna structure 1038 by way of an antenna switch module (ASM) 1036. The ASM 1036 may be configured to couple the received RF signals, Rx, to the transceiver 1034 along a receive chain.

In various embodiments, the antenna structure 1038 may include one or more directional and/or omnidirectional antennas, including, e.g., a dipole antenna, a monopole antenna, a patch antenna, a loop antenna, a microstrip antenna or any other type of antenna suitable for over-the-air transmission/ reception of RF signals.

In various embodiments, the system 1000 may be used for high radio frequency power and frequency applications. For example, the system 1000 may be suitable for any one or more of terrestrial and satellite communications, radar systems, and possibly in various industrial and medical applications. Radar applications may include military-use radar, air traffic control, navigation, and the like. In various embodiments, the system 1000 may be a selected one of a radar device, a satellite communication device, a mobile handset, a cellular telephone base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
a first barrier layer including aluminum;
a gallium nitride channel layer on the first barrier layer; and
a second barrier layer including a first aluminum gallium nitride sublayer directly on the gallium nitride channel layer, an aluminum-free gallium nitride sublayer directly on the first sublayer, and a second aluminum gallium nitride sublayer directly on the aluminum-free gallium nitride sublayer, wherein each of the first aluminum gallium nitride sublayer and the second aluminum gallium nitride sublayer including aluminum at a concentration greater than a concentration of aluminum of the first barrier layer.

2. The apparatus of claim 1, wherein the first barrier layer is aluminum gallium nitride, and wherein the gallium nitride channel layer is directly on the first barrier layer.

3. The apparatus of claim 1, further comprising a substrate, wherein the first barrier layer is directly on the substrate, and wherein the substrate comprises silicon carbide, gallium nitride, aluminum nitride, or silicon.

4. The apparatus of claim 1, further comprising a gate electrode recessed into the second aluminum gallium nitride sublayer.

5. The apparatus of claim 4, wherein the gate electrode is a T-gate.

6. The apparatus of claim 4, wherein the gate electrode, the first barrier layer, the gallium nitride channel layer, and the second barrier layer form an enhancement-mode transistor.

7. The apparatus of claim 6, wherein the gate electrode comprises a first gate electrode, and wherein the apparatus further comprises a second gate electrode disposed on the second barrier layer, wherein the second gate electrode, the first barrier layer, the gallium nitride channel layer, and the second barrier layer form a depletion-mode transistor.

8. The apparatus of claim 4, further comprising an insulating layer between the gate electrode and the second sublayer.

9. The apparatus of claim 1, wherein the first sublayer is on the gallium nitride channel layer, and wherein the HEMT further comprises an etch stop layer between the second sublayer and the third sublayer.

10. A method comprising:
forming a first barrier layer including aluminum;
forming a gallium nitride channel layer on the first barrier layer;
forming a first aluminum gallium nitride sublayer directly on the gallium nitride channel layer;
forming an aluminum-free gallium nitride sublayer directly on the first aluminum gallium nitride sublayer; and
forming a second aluminum gallium nitride sublayer directly on the aluminum-free gallium nitride sublayer,
wherein the first aluminum gallium nitride sublayer and the second aluminum gallium nitride sublayer each include aluminum at a concentration greater than a concentration of aluminum of the first barrier layer.

11. The method of claim 10, wherein the first barrier layer is aluminum gallium nitride, and wherein the gallium nitride channel layer is directly on the first barrier layer.

12. The method of claim 10, further comprising forming a first gate electrode recessed into the third sublayer.

13. The method of claim 12, further comprising forming a second gate electrode on the second barrier layer.

14. The method of claim 13, further comprising forming an etch stop layer between the second sublayer and the third sublayer, and wherein the forming a gate electrode comprises forming a gate electrode recessed into the third sublayer down to the etch stop layer.

\* \* \* \* \*